(12) United States Patent
Weng et al.

(10) Patent No.: US 9,299,839 B2
(45) Date of Patent: Mar. 29, 2016

(54) PFET AND CMOS CONTAINING SAME

(71) Applicant: UNITED MICROELECTRONICS CORPORATION, Hsinchu (TW)

(72) Inventors: Wen-Yin Weng, Taichung (TW);
Cheng-Tung Huang, Kaoshiung (TW);
Wei-Heng Hsu, Kaohsiung (TW);
Yi-Ting Wu, Taipei (TW); Yu-Ming Lin, Tainan (TW); Jen-Yu Wang, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/505,509

(22) Filed: Oct. 3, 2014

(65) Prior Publication Data
US 2016/0064563 A1    Mar. 3, 2016

(30) Foreign Application Priority Data

Sep. 1, 2014 (TW) .............................. 103130143 A

(51) Int. Cl.
| | | |
|---|---|---|
| H01L 21/02 | (2006.01) | |
| H01L 29/78 | (2006.01) | |
| H01L 27/092 | (2006.01) | |

(52) U.S. Cl.
CPC .......... *H01L 29/7848* (2013.01); *H01L 27/092* (2013.01); *H01L 29/7845* (2013.01)

(58) Field of Classification Search
CPC ...................... H01L 21/0245; H01L 21/02532
See application file for complete search history.

(56) References Cited

U.S. PATENT DOCUMENTS

| | | | |
|---|---|---|---|
| 7,274,055 B2 | 9/2007 | Murthy | |
| 7,544,997 B2* | 6/2009 | Zhang et al. | 257/344 |
| 7,592,619 B2* | 9/2009 | Tsai et al. | 257/19 |
| 7,667,385 B2 | 2/2010 | Lee | |
| 8,324,043 B2* | 12/2012 | Kim et al. | 438/233 |
| 8,395,165 B2 | 3/2013 | Chen | |
| 8,703,592 B2* | 4/2014 | Kim et al. | 438/525 |
| 8,835,995 B2* | 9/2014 | Kang et al. | 257/288 |
| 8,937,343 B2* | 1/2015 | Kim et al. | 257/255 |
| 2002/0130393 A1* | 9/2002 | Takayanagi et al. | 257/616 |
| 2009/0095992 A1* | 4/2009 | Sanuki et al. | 257/288 |

OTHER PUBLICATIONS

Datta, S., Pandey, R. ; Agrawal, A. ; Gupta, S.K. ; Arghavani, R. , Impact of contact and local interconnect scaling on logic performance , VLSI Technology (VLSI-Technology): Digest of Technical Papers, 2014 Symposium on , Jun. 9-12, 2014 , 1-2 , Honolulu, HI.

* cited by examiner

*Primary Examiner* — Eugene Lee
(74) *Attorney, Agent, or Firm* — Ding Yu Tan

(57) ABSTRACT

A P-type field effect transistor includes: a gate area; an insulated area, adjacent to the gate area; a source region and a drain region made by silicon germanium, respectively, adjacent to the second side of the insulated area; a channel area, adjacent to the insulated area and formed between the source region and the drain region; a conductive layer, electrically connected to the source region and the drain region, respectively; and a plurality of capping layers, connected between the conductive layer and the source/drain regions, wherein the silicon layer(s) and the silicon germanium layer(s) are stacked alternately, and of which a silicon layer contacts the source/drain silicon germanium regions, while a silicon germanium layer contacts the conductive layer. The present invention also provides a complementary metal oxide semiconductor transistor including the P-type field effect transistor mentioned above.

3 Claims, 4 Drawing Sheets

PFET AND CMOS CONTAINING SAME

FIELD OF THE INVENTION

The present invention relates to field effect transistors, and more particularly relates to metal oxide semiconductor transistors.

BACKGROUND OF THE INVENTION

Metal oxide semiconductor transistors (MOS) are important basic electronics components in semiconductor technology. MOS devices can be substantially divided into three types: (1) N-channel MOS (NMOS), (2) P-channel MOS (PMOS), and (3) Complementary MOS (CMOS). A CMOS is composed by an NMOS and a PMOS. Such kind of transistors, wherein the ON/OFF state are determined by the values of gate voltages, and the values of the current flowing through the transistor channel are determined by the source voltages, are called field effect transistors (FET), and therefore NMOS and PMOS are called NFET and PFET, respectively.

There are resistances in a transistor device exist within the material itself, the junction of two kinds of materials, or a specific structure of the transistor . . . , and so on. These resistances have significant influences on the performances of transistor elements. The main resistances of a transistor include the channel resistance formed between the drain region and the source region, and the other resistances commonly known as extrinsic resists. As the MOS device 1 shown in FIG. 1, there is an extrinsic resistance including a contact resistance 12 formed between a source 11 and a conductive metal layer 12, the internal resistance of the conductive metal layer 12 itself (metal resist), and an extension resistance formed between a gate 13 and the source (or drain) 11. When the MOS manufacturing process proceeds to a smaller line width (for example, from 90 nm to 22 nm), the shorter the length of the channel, the smaller the channel resistance will be, but vice versa the extrinsic resistance. Accordingly, it has become an important subject to reduce the extrinsic resistance for manufacturing MOS devices.

The extrinsic resistance is dominated by the contact resistance, and the value of the contact resistance is mainly determined by the following equation (1) to the resistivity $\rho_c$:

$$\rho_c \propto \exp\left[\frac{4\pi\phi_B}{qh}\sqrt{\frac{m*\varepsilon_{Si}}{N_D}}\right] \quad (1)$$

Among numerical members in equation (1), metal-semiconductor work function $\Phi_B$, semiconductor doping $N_D$, and effective carrier mass m* are variables, while other symbols represent well-known constants and will not be described here.

Conventional MOS structures utilize metal layers as drain/source contacts. The metal layers are usually made of silicide, such as nickel silicide, titanium silicide, etc. However, since the metal layer is in direct contact with the semiconductor layer (MS contact), there are defects found in the contact surface between the two layers, resulting in that the work function can not be decreased, which is a fermi level pinning causing the contact resistance to be remained in a high level. To solve this problem, S. Datta et al (2014 Symposium on VLSI Technology Digest of Technical Papers) add another insulating layer (Insulator) in the traditional metal/semiconductor junction, making it a MIS structure, such that the work function is effectively reduced.

However, although the above-described MIS structure effectively reduces the contact resistance of a NFET, it is difficult to select a suitable insulating layer to reduce the contact resistance of a PFET and thus the overall contact resistance of a CMOS still cannot be reduced effectively, which becomes the problem to be resolved. U.S. Pat. No. 7,274,055 discloses the concept of choosing suitable materials to reduce the contact resistance. However, in the structure disclosed by this patent, a polysilicon capping layer is used for connecting drain/source SiGe layer and the metal layer. Subject to the material properties of silicon itself, the contact resistance still cannot be reduced to be meeting a demand or requirement level.

SUMMARY OF THE INVENTION

An object of the present invention is to reduce the above-mentioned contact resistance, so as to obtain a transistor structure meet the requirement of a scaled-down semiconductor elements. In an embodiment of the present invention, a PFET includes a gate region; an insulator region beneath the gate region; a SiGe source region and a SiGe drain region, respectively adjacent to the insulator region; a channel region beneath the insulator region and formed between the SiGe source region and the SiGe drain region; a conductive layer electrically connected to the SiGe source region and the SiGe drain region; and a plurality of capping layers connected between the conductive layer and the SiGe source region, and connected between the conductive layer and the SiGe drain region, wherein the capping layers includes at least one silicon layer and at least one silicon germanium layer alternatively stacked with the at least one silicon layer, and the SiGe source region and the SiGe drain region is contacted with one of the at least one silicon layer, while the conductive layer is contacted with one of the at least one silicon germanium layer.

The conductive layer may be a metal silicide layer. The work function of the conductive layer is not more than 4.2 eV.

The present invention further provide a complementary metal oxide semiconductor transistor, which includes a substrate; the above-mentioned PFET formed on the substrate; and an NFET formed on the substrate; wherein the N-type field effect transistor includes a gate region; an insulator region beneath to the gate region of the N-type field effect transistor; a source region and a drain region respectively adjacent to the insulator region of the N-type field effect transistor; a channel region adjacent to the insulating region of the N-type field effect transistor and formed between the source region and the drain region of the N-type field effect transistor; a conductive layer electrically connected to the source region and the drain region of the N-type field effect transistor; and an insulator layer formed between the conductive layer and the source region, and the conductive layer and the drain region. The conductive layer of the PFET and the conductive layer of the NFET are formed simultaneously, and the work functions of both the conductive layers are not greater than 4.2 eV.

In summary, the invention improves the problems caused by the high contact resistance of a conventional device by the modified capping layers of MS structure in PFET, together with the NFET having MIS structure, and the conductive layer with limited work function.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
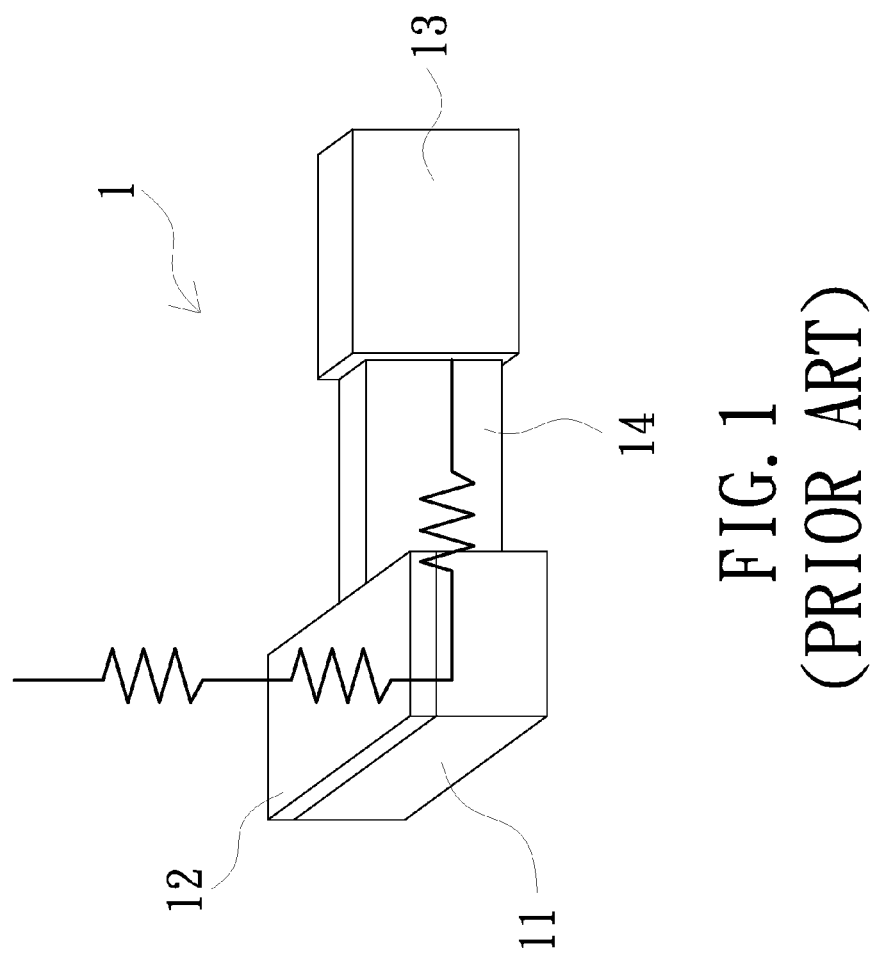
FIG. 1 is a schematic view of an extrinsic resistance of a MOS device.
Figure 2:
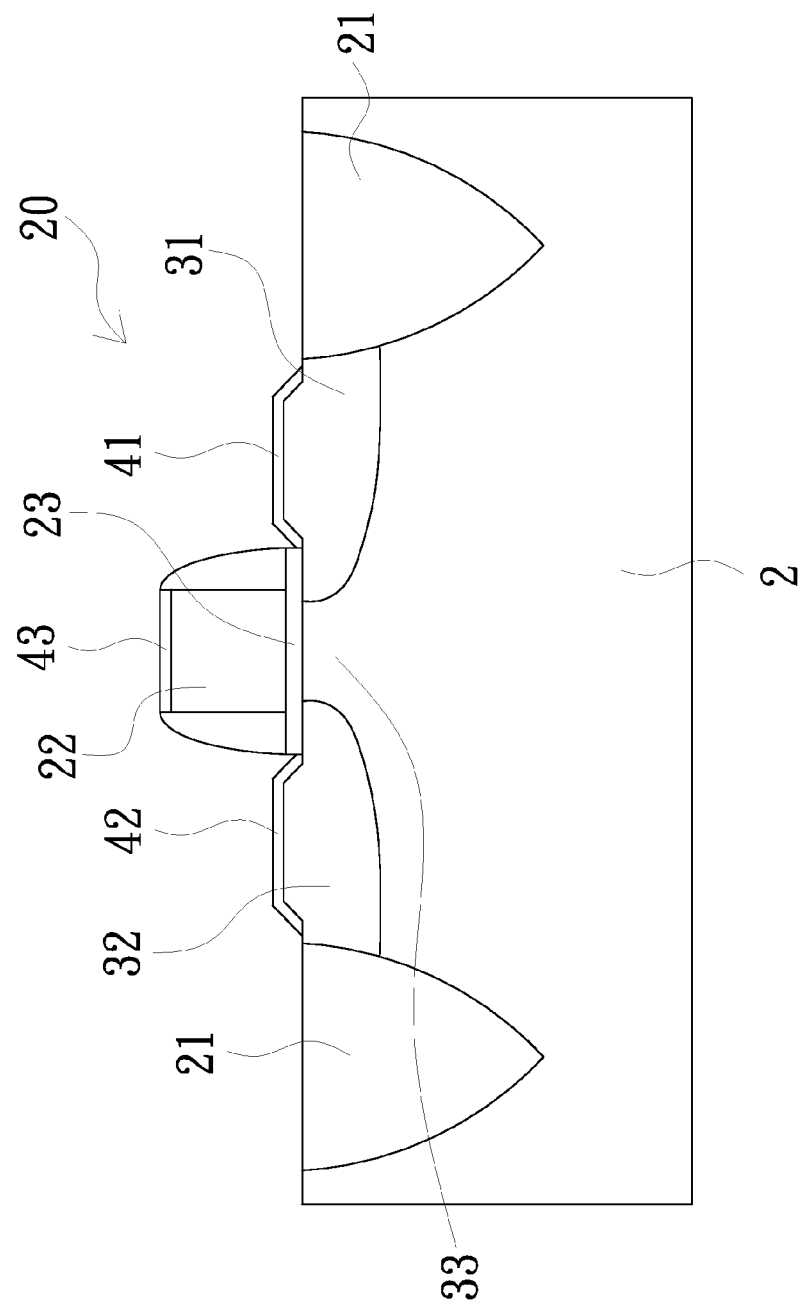
FIG. 2 is a schematic sectional view of a P-type field effect transistor according to an embodiment of the present invention.

Refer to FIG. 2, a PFET 20 is formed between two isolator regions 21 on a substrate 2 to be isolated with other elements (not shown) on the substrate 2. The PFET 20 includes a gate region 22; an insulator region 23 beneath the gate region 22; a SiGe source region 31 and a SiGe drain region 32 respectively adjacent to the insulator region 23; a channel region 33 located beneath the insulator region 23 and formed between the SiGe source region 31 and the SiGe drain region 32; and a plurality of electrically conductive contact structures 41, 42, 43, respectively formed and electrically connected to the tops of the SiGe source region 31, the SiGe drain region 32, and the gate region 22. Wherein, the electrically conductive contact structures 41, 42 may be formed simultaneously in the same process step, and thus will have the same structure.

Figure 3:
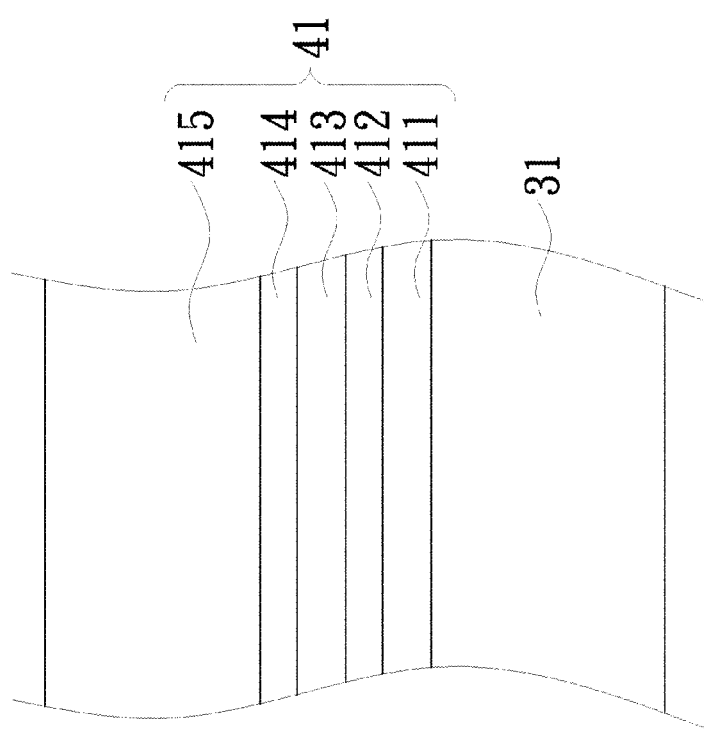
FIG. 3 is an partially enlarged view of the contact structure shown in FIG. 2.

The contact structure 41 shown in FIG. 3, for example, is composed by a plurality of capping layers 411, 412, 413, 414 covering the SiGe source region 31, and a conductive layer 415 formed above the capping layer 414. The contact structure 42 formed above the SiGe drain region 32, and the contact structure 43 formed above the gate region 22 will have similar structure as that of the contact structure 41, since they are simultaneously formed by the same process. The capping layers 411, 412, 413, 414 are alternatively stacked silicon layers and silicon germanium layers; Wherein, the capping layer 411, contacted with the SiGe source region 31 and the SiGe drain region 32, is a silicon layer; the capping layer 414, contacted with the conductive layer 415, is a silicon germanium layer; and the capping layers 412, 413 are a silicon germanium layer and a silicon layer, respectively. The conductive layer 415 may be selected from materials for forming silicide having the work function not more than 4.2 eV, such that the extrinsic resistance of the PFET 20 can be further reduced.

The number of the above-mentioned capping layers can be varied according to various requirements in different applications, as long as the layer contacted with the conductive layer is a silicon germanium layer. In the PFET 20, the conductive layer 415 is in contact with the silicon germanium layer 414 instead of a silicon layer in a conventional device. Since SiGe has a greater semiconductor doping $N_D$ and a smaller effective carrier mass $m^*$ than Si, according to equation (1), the contact resistance of the PFET 20 of the embodiment of the present invention can be reduced effectively.

Figure 4:
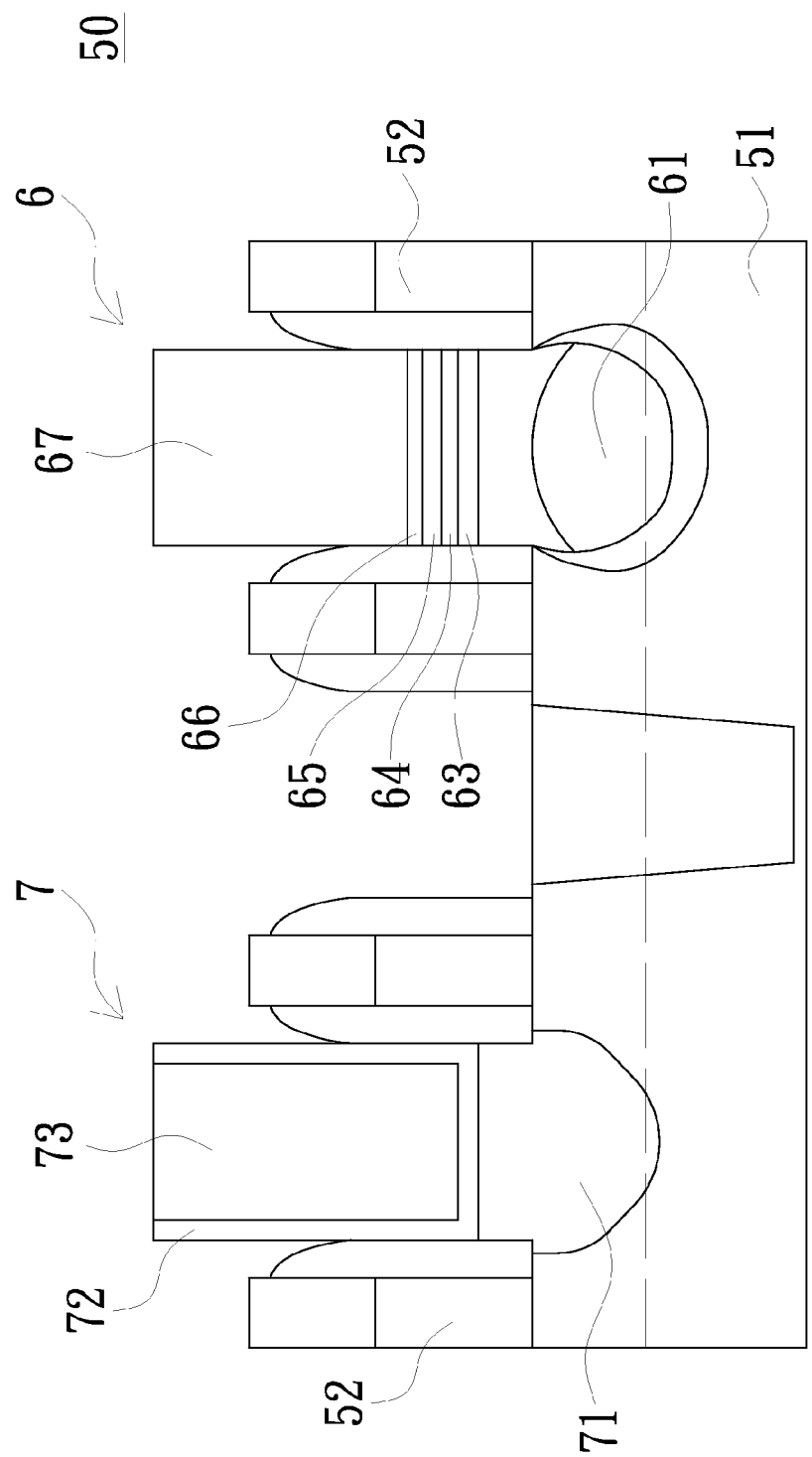
FIG. 4 is a cross-sectional schematic illustration of a CMOS according to an embodiment of the present invention.

The structure of the PFET 20 can be applied to complementary metal oxide semiconductor transistors, coupled with the use of the aforementioned MIS structure, proposed by S. Datta et al, in N-type field effect transistors, and the selection of the conductive layer having work function not greater than 4.2 eV, the extrinsic resistance of the CMOS transistors can be significantly reduced within a desired range. FIG. 4 illustrates a CMOS transistor 50 having a plurality of fin-like structures 52 (e.g., the fin-shaped channel of a FinFET . . . etc.). It should be noticed that each element is identified in FIG. 4 for the sake of schematic explanation convenience, and is not meant to be limiting as for its actual configuration or structure of the CMOS transistor 50. The CMOS transistor 50 includes a PFET 6 and a NFET 7 formed on a substrate 51. Wherein, the gate regions, the insulating regions, the source regions, the drain regions, the channel regions, the conductive layers and the insulating layers of the PFET 6 and the NFET 7 can be formed via conventional CMOS manufacturing process. Except for different structures, materials and spatial configurations between PFET and NFET, or the differences in structures of plannar/non-plannar transistors, the connecting relationships among elements of the CMOS transistor 50 are roughly the same with those of the MOS device as shown in FIG. 2, and will not be described repeatedly here.

Compared with the conventional CMOS transistor, the mainly different parts of CMOS transistor 50 are capping layers 63, 64, 65, 66 formed between the source/drain region 61 and the conductive layer 67 of PFET 6, respectively composed by Si/SiGe/Si/SiGe, so that the conductive layer 67 is in contact with the silicon germanium layer 66, which significantly reduces the contact resistance of semiconductor/metal layers in PFET 6. On the other hand, in NFET 7, drain/source regions 71 does not, as that in a traditional NFET does, directly contact with conductive layer 73. Instead, insulating layer 72 is formed between drain/source regions 71 and conductive layer 73, in order to avoid the Fermi level pinning which will keep contact resistance in high level. In addition, conductive layer 67 of PFET 6 and conductive layer 73 of NFET are formed simultaneously in a manufacturing process, and the work functions of both are not greater than 4.2 eV, which make the extrinsic resistance of CMOS transistor 50 be further reduced.

In summary, in the present invention, the contact resistance of semiconductor/metal junction are reduced in PFET by changing the structure of the capping layers between the SiGe drain/source region and the conductive layer. The capping layers are alternately stacked Si/SiGe layers, and the one of which in contact with the conductive layer is a silicon germanium layer. Accordingly, the contact resistance is reduced because of the relatively larger semiconductor doping (carrier concentration) and the relatively lower effective carrier mass of the silicon germanium layer. In addition, the structure of such PFET can be combined with NFET having MIS structure to form a CMOS device having conductive layer with work function no greater than 4.2 eV, and thus the overall extrinsic resistance of the CMOS will be significantly reduced to a desired value which can reach the demand on practical applications. Although the present invention has been described above in the preferred embodiment to expose, then it is not intended to limit the present invention, any of those familiar with this art, without departing from the spirit and scope of the present invention within, it is intended that the modifications and variations of the present invention is therefore as defined in the scope of patent protection when the range depending on whichever is attached.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A P-type field effect transistor comprising:
a gate region;
an insulator region beneath the gate region;
a SiGe source region and a SiGe drain region, respectively adjacent to the insulator region;
a channel region beneath the insulator region and formed between the SiGe source region and the SiGe drain region;
two conductive layers electrically connected to the SiGe source region and the SiGe drain region respectively, wherein the work function of each of the two conductive layers is not more than 4.2 eV; and
a plurality of capping layers connected between one of the two conductive layers and the SiGe source region, and connected between the other one of the two conductive layers and the SiGe drain region, wherein the capping layers includes more than one silicon layers and more than one silicon germanium layers alternatively stacked with the more than one silicon layers, and the SiGe source region and the SiGe drain region are contacted with one of the more than one silicon layers, while the two conductive layers are contacted with one of the more than one silicon germanium layers.

2. The P-type field effect transistor according to claim 1, wherein each of the two conductive layers is a metal silicide layer.

3. A complementary metal oxide semiconductor transistor including a P-type field effect transistor according to claim 1, comprising:
a substrate;
the P-type field effect transistor formed on the substrate; and
an N-type field effect transistor formed on the substrate; wherein the N-type field effect transistor includes:
a gate region;
an insulator region beneath to the gate region of the N-type field effect transistor;
a SiGe region adjacent to the insulator region of the N-type field effect transistor;
a conductive layer electrically connected to the SiGe region of the N-type field effect transistor; and
an insulator layer formed between the conductive layer and the SiGe region, wherein the conductive layer of the P-type field effect transistor and the conductive layer of the N-type field effect transistor are formed simultaneously, and the work functions of both the conductive layers are not greater than 4.2 eV.

* * * * *